(12) United States Patent  
Mulder

(10) Patent No.: US 7,397,535 B2  
(45) Date of Patent: Jul. 8, 2008

(54) LITHOGRAPHIC APPARATUS AND DEVICE MANUFACTURING METHOD

(75) Inventor: Heine Melle Mulder, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 165 days.

(21) Appl. No.: 11/312,649

(22) Filed: Dec. 21, 2005

(65) Prior Publication Data

US 2007/0139634 A1  Jun. 21, 2007

(51) Int. Cl.  
*G03B 27/42* (2006.01)  
*G03B 27/54* (2006.01)

(52) U.S. Cl. .......................................... 355/53; 355/67

(58) Field of Classification Search ................... 355/53, 355/67, 55, 68; 359/15  
See application file for complete search history.

(56) References Cited

U.S. PATENT DOCUMENTS

| | | | |
|---|---|---|---|
| 5,121,160 A | 6/1992 | Sano et al. | |
| 5,724,122 A | 3/1998 | Oskotsky | |
| 5,991,016 A | 11/1999 | Irie | |
| 6,870,603 B2 | 3/2005 | Teeuwen | |
| 2004/0114122 A1* | 6/2004 | Teeuwen | 355/68 |
| 2005/0270608 A1* | 12/2005 | Shiozawa et al. | 359/15 |

* cited by examiner

*Primary Examiner*—Peter B Kim  
(74) *Attorney, Agent, or Firm*—Pillsbury Winthrop Shaw Pittman, LLP

(57) ABSTRACT

Lithographic apparatus includes an illumination system for conditioning a radiation beam, a support for supporting a patterning device for imparting a cross-sectional pattern to the radiation beam to form a patterned radiation beam, and a substrate table for holding a substrate. A projection system is provided for projecting the patterned radiation beam onto a target portion of the substrate. Conditioning optics and an adjustable aperture are provided to condition the radiation beam from the illumination system, and a detector is provided to detect the size and divergence of the radiation beam propagated through the aperture and to provide a feedback signal in dependence thereon. An actuator serves to effect adjustment of at least one of the optics and the aperture to vary at least one optical characteristic of the radiation beam, and a control device is provided to control the actuator in response to the feedback signal from the detector.

21 Claims, 2 Drawing Sheets

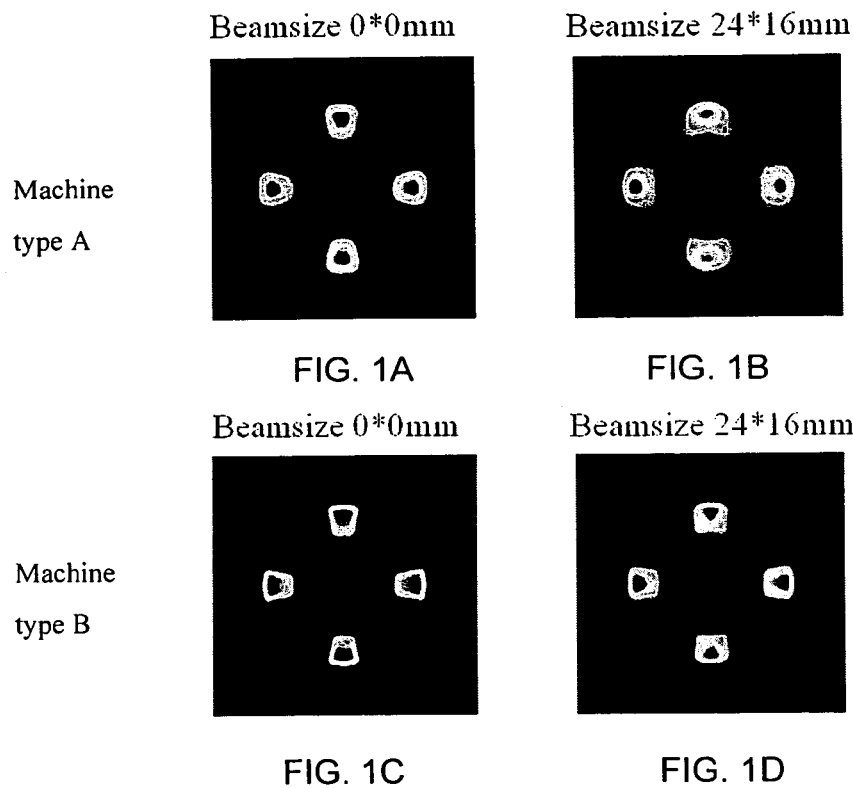
Beamsize 0*0mm     Beamsize 24*16mm
Machine type A
FIG. 1A     FIG. 1B
Beamsize 0*0mm     Beamsize 24*16mm
Machine type B
FIG. 1C     FIG. 1D
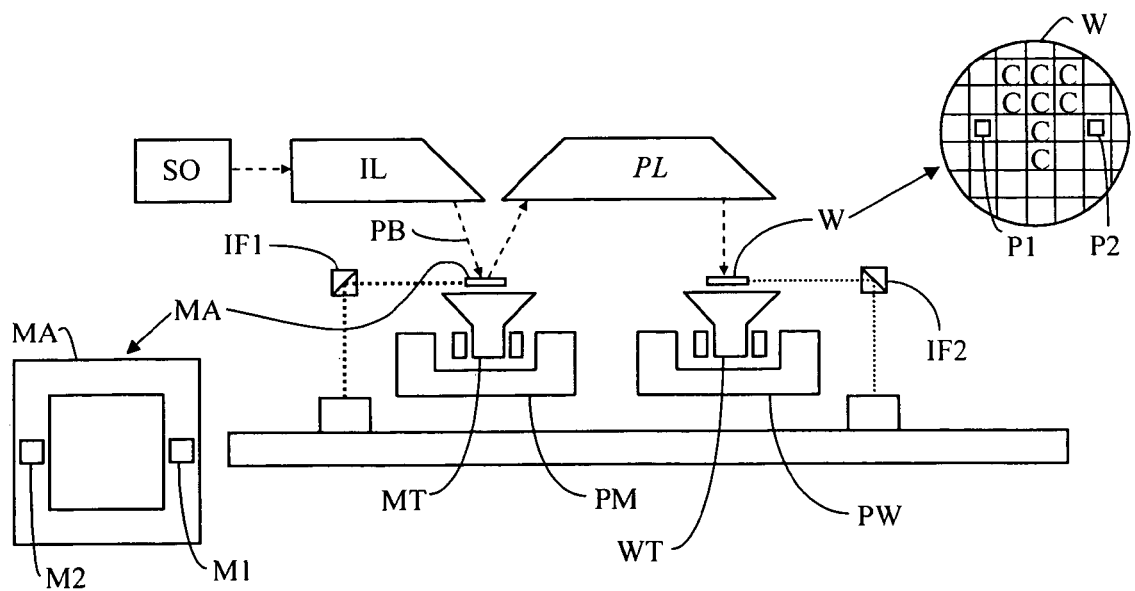
Fig. 2

LITHOGRAPHIC APPARATUS AND DEVICE MANUFACTURING METHOD

FIELD OF THE INVENTION

The present invention relates to lithographic apparatus and a device manufacturing method. In particular, the invention relates to a method of adjusting beam characteristics of the radiation beam within such apparatus.

BACKGROUND OF THE INVENTION

Lithographic apparatus comprises a machine that applies a desired pattern onto a target portion of a substrate. Lithographic apparatus can be used, for example, in the manufacture of integrated circuits (ICs). In that instance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Lithographic apparatus may be of the transmissive type, where radiation is passed through a mask to generate the pattern, or of the reflective type, where radiation is reflected from the mask to generate the pattern. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction. It is also possible to transfer the pattern from the patterning device to the substrate by imprinting the pattern onto the substrate.

Developments in the field of lithography for improving projection image quality have demonstrated the need to improve certain optical characteristics of the radiation beam. Generally these optical characteristics comprise the homogeneity or uniformity of the beam, the size and/or shape of the beam, the pointing direction of the beam, the position of the beam with respect to the optical axis, and the divergence of the beam, all of which will be referred to collectively hereafter as "optical characteristics" of the beam. Currently only limited options are available to control such beam optical characteristics in lithographic apparatus. In particular it is possible for the optics of the illumination system of such apparatus to be adjusted by means of adjusting screws during installation based upon information received from a beam analysis module.

The characteristics of the radiation beam have an effect on the angular distribution delivered by the illumination system. In the current state of the art, the angular distribution is changed by changing the positions of optical elements within the illumination system in a predetermined way. However the optical characteristics of the input radiation beam are not taken into account in the control of the angular distribution.

U.S. Pat. No. 6,870,603 discloses lithographic apparatus incorporating a tiltable steering mirror for directing the radiation beam to a projection system, and for adjusting lateral displacement of the beam in X- and Y-directions relative to an aperture formed by a diffractive optical element within the projection system. A processor is provided for receiving information relating to the tilt of the mirror, as well as information relating to the beam intensity measured by a detector within the illumination system. By varying the tilt angle of the mirror and making corresponding measurements of the beam intensity, it is possible to determine the beam size. Furthermore the beam size can be adjusted by means of an optical conditioning unit through which the beam is passed before being supplied to the mirror. However, it is not practicable to use such an arrangement for adjusting the size and divergence of the beam to match the beam to a target pupil shape.

U.S. Pat. No. 5,121,160 discloses exposure apparatus incorporating a beam expander and a zoom expander for adjusting the shape and size of a radiation beam supplied to a projection system. Furthermore a photodetector is provided on the support for the substrate to be exposed to provide measurements of the illuminance at the image surface of the projection system. Such an arrangement does not enable adjustment of the beam on the basis of the detected size and divergence of the beam.

U.S. Pat. No. 5,724,122 and U.S. Pat. No. 5,991,016 also disclose arrangements for adjustment of the radiation beam in an exposure system, but such arrangements again to do enable adjustment of the beam in dependence on the detected size and divergence of the beam.

SUMMARY OF THE INVENTION

Aspects of embodiments of the present invention enable the size and divergence of the projection beam in such lithographic apparatus to be controlled so as to match it to a target pupil size and shape.

According to an aspect of the invention, there is provided a lithographic apparatus including an illumination system configured to condition a radiation beam, a support constructed to support a patterning device, the patterning device being constructed to impart a cross-sectional pattern to the radiation beam to form a patterned radiation beam, a substrate table constructed to hold a substrate, a projection system configured to project the patterned radiation beam onto a target portion of the substrate, an aperture configured to permit propagation of the radiation beam from a radiation source to the illumination system, a beam expander configured to change the size and divergence of the radiation beam, a detector configured to detect the size and divergence of the radiation beam propagated through the aperture and to provide a feedback signal in dependence thereon, an actuator configured to effect adjustment of at least one of the beam expander and the aperture to vary at least one optical characteristic of the radiation beam, and a control device configured to control the actuator in response to the feedback signal from the detector.

Such an arrangement may enable the beam size and/or divergence to be adjusted, for example at the level of a diffractive optical element (DOE) for conditioning the beam to pass through the aperture towards the illumination system. This enables the desired pupil shape and divergence to be obtained so that, for example, the sigma of the beam is made the same for each lithographic machine used in a particular fabrication procedure. This is useful because, where more than one machine is used for exposure of the same layer on a wafer, there should be no, or minimal, difference between the image that is exposed by the different machines. It is accordingly important that the sigmas of the machines should be matched to a high level of accuracy. Such an arrangement can be used to match pupil shapes between systems of the same type or systems of different types, and to improve the resolution for very small pole angles or extreme pupils.

Use of such an arrangement also enables a stable slit shape to be produced for FDE based systems, where FDE denotes a field defining element, that is an optical element that mixes the light to a uniform intensity distribution in the desired shape. In particular such an arrangement enables the divergence of the beam to be tuned to compensate set-get differences for sigma, and the size of the beam to be tuned to match pole angles. It is very important that machines behave in a predictable way. If a process is developed on one system and a fabrication run is effected using systems of the same type, the process should run identically on each system. Also, when the process is transferred to a different type of machine (a newer machine with better optical performance), the newer machine should be able to reproduce the angular distribution (also referred to as pupil shape) of the machine that the process has been developed on. that the reason for this is because the reticle requires to be tuned (optical proximity correction) and the tuning is time consuming. It is therefore important to match machines of the same type (intra-machine-type) and machines of different types (inter-machine-type). The feedback arrangement can also be controlled to maintain the beam size constant. In particular the convolution effect as a function of zoom and beam shape can be compensated for, leading to stable slit shapes and improved DC and uniformity correction for FDE based systems.

The NA of the projection system of a state of the art lithography tool is typically >0.90 or even larger than 1.0 for immersion systems. The NA provides an indication of the maximum angle of radiation that can be received by the projection system. Typically the magnification of the projection lens is −0.25, i.e. the image on the reticle is de-magnified 4 times. The angular distribution delivered by the illumination system is usually described in terms of sigma. In a plane that is a Fourier-transform of the reticle-image plane, the angular distribution is an intensity distribution as shown in FIG. 4. This plane is generally referred to as the pupil plane. In this figure the maximum angle that can pass the NA of the projection system is represented by a position on the circle with radius 1. The angle at reticle level is given by Asian (NA*projection lens_magnification).

To derive a sigma value from the pupil shown in the figure several different conventions can be used. In this case sigma outer is defined as the radius of a circle encircling 90% of the energy in the pupil, whereas sigma inner is defined as the radius of a circle encircling 10% of the energy in the pupil.

In many cases it is advantageous to have a high sigma, although in some cases it is more important that the sigma does not change than that the sigma has a very high value. For example, if a sigma of 0.9 is specified for a number of machines, it is highly undesirable for a sigma of 0.91 to be obtained, as this would adversely affect various properties of the machine and lead to differences in the projected pattern.

The actuator may be configured to adjust the size of the aperture. Alternatively or additionally the actuator may be configured to optically adjust a beam expander in order to vary the size of the radiation beam and/or the divergence of the radiation beam.

In a particular embodiment a tiltable beam-positioning reflector is provided for directing the radiation beam propagated through the aperture towards the illumination system.

The aperture is preferably positioned upstream of the beam-positioning reflector. Less advantageously the aperture may be positioned downstream of the beam-positioning reflector.

Furthermore at least one further reflector may be provided in the path of the radiation beam between the beam-positioning reflector and the illumination system.

A diverter may be provided for diverting a minor portion of the radiation beam to the detector upstream of the illumination system. The diverter may be a partially transparent mirror.

According to a further aspect of the invention, there is provided a device manufacturing method including providing a substrate, directing a beam of radiation from a radiation source to an illumination system, propagating the radiation beam through a beam expander and an aperture, detecting the size and divergence of the radiation beam propagated through the aperture to provide a feedback signal in dependence thereon, effecting adjustment of at least one of the beam expander and the aperture to vary at least one optical characteristic of the radiation beam in response to the feedback signal, using a patterning device to transmit or reflect the radiation beam and impart a pattern to the cross-section of the radiation beam, and projecting the patterned beam of radiation onto a target portion of the substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LADS), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a meteorology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 NM) and extreme ultra-violet (EUR) radiation (e.g. having a wavelength in the range of 5-20 NM), as well as particle beams, such as ion beams or electron beams.

The term "patterning device" used herein should be broadly interpreted as referring to any means that can be used to impart a cross-sectional pattern to the radiation beam to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LAD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bears the weight of, the patterning device. It holds the patterning device in a way that depends on the orientation of the patterning device, the design of the lithographic apparatus, and other conditions, such as for example whether or not the patterning device is held in a vacuum environment. The support can use mechanical clamping, vacuum clamping, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be supplied to other spaces in the lithographic apparatus, for example between the mask and the first element of the projection system. Immersion techniques are well known in the art for increasing the numerical aperture of projection systems.

BRIEF DESCRIPTION OF THE DRAWINGS

FIGS. 1A-1D shows the different responses of two different lithographic systems to non-ideal beams.

FIG. 2 depicts lithographic apparatus having a reflective mask.

Figure 3:
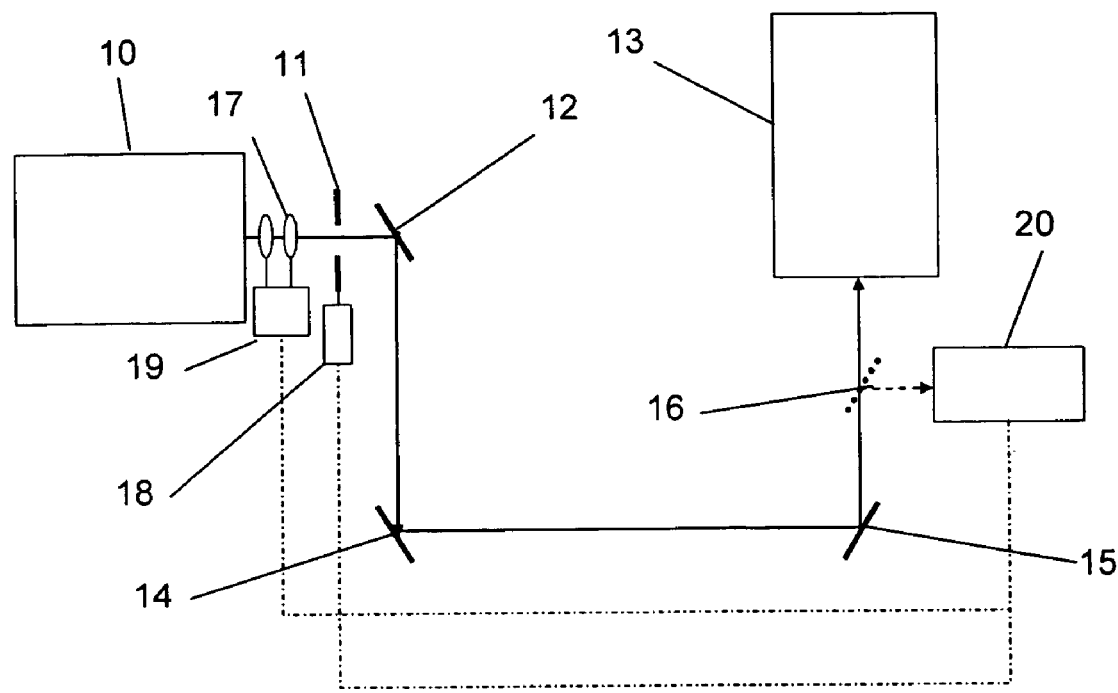
FIG. 3 is diagram of a beam control arrangement of a preferred embodiment of the invention.
Figure 4:
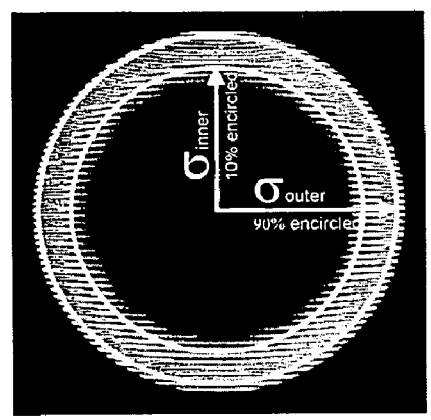
FIG. 4 shows the angular distribution delivered by the illumination system of such apparatus.

While the invention is susceptible to various modifications and alternative forms, a specific embodiment thereof has been shown by way of example in the accompanying drawings and will herein be described in detail. It should be understood, however, that this specification is not intended to limit the invention to the particular forms disclosed herein, but on the contrary, the intention is to cover all modifications, equivalents, and alternatives falling within the scope of the invention, as defined by the appended claims.

DETAILED DESCRIPTION OF EMBODIMENTS OF THE INVENTION

FIG. 2 schematically an example of lithographic apparatus including:

an illumination system (illuminator) IL for providing a projection beam PB of radiation (e.g. UV radiation).

a first support structure (e.g. a mask table) MT for supporting a patterning device (e.g. a mask) MA and connected to first positioning means PM for accurately positioning the patterning device with respect to item PL;

a substrate table (e.g. a wafer table) WT for holding a substrate (e.g. a resist-coated wafer) W and connected to second positioning means PW for accurately positioning the substrate with respect to item PL; and a projection system (e.g. a refractive or reflective projection lens) PL for imaging a pattern imparted to the projection beam PB by the patterning device MA onto a target portion C (e.g. comprising one or more dies) of the substrate W.

As depicted in FIG. 2, the apparatus is of a reflective type (i.e. employing a programmable mirror array).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In the case of the reflective system shown in FIG. 2 the source may be a plasma discharge source and a radiation collector (not shown), comprising for example suitable collecting mirrors and/or a spectral purity filter, may be used to pass the radiation beam from the source SO to the illuminator IL. In other cases the source may be integral part of the apparatus, for example when the source is a mercury lamp. The source SO and the illuminator IL, together with the beam delivery system BD or radiation collector if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed (FIGS. 1A-1D) or been reflected by (FIG. 2) the mask MA, the projection beam PB passes through the lens PL, which focuses the beam onto a target portion C of the substrate W. With the aid of the second positioning means PW and position sensor IF2 (e.g. an interferometric device), the substrate table WT can be moved accurately, e.g. so as to position different target portions C in the path of the beam PB. Similarly, the first positioning means PM and another position sensor IF1 (which is shown in FIG. 2 but not explicitly depicted in FIGS. 1A-1D) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning means PM and PW. However, in the case of a stepper (as opposed to a scanner) the mask table MT may be connected to a short stroke actuator only, or may be fixed.

Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT. is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning means, and the substrate table WT is moved or scanned while a pattern imparted to the projection beam is projected onto a target portion C. In this mode, generally a pulsed radiation source is employed and the programmable patterning means is updated as required after each movement of the substrate table WT or in between successive radiation pulses during a scan. This mode of operation can be readily applied to maskless lithography that utilizes programmable patterning means, such as a programmable mirror array of a type as referred to above.

Combinations and/or variations on the above described modes of use or entirely different modes of use may also be employed.

As indicated above the illuminator provides a conditioned beam of radiation, referred to as the projection beam, having a desired uniformity and intensity distribution in its cross-section. However the increasing trend for complexity of the pupil shapes (having small poles or ring widths) imposes an increased requirement for matching of pupil shapes to required pupil shapes for lithographic systems of the same type or lithographic systems of different types. Small pole pupil shapes require very small (typically square) beam size and low divergence in the X and Y directions. Not all lithographic systems suffer to the same extent in this regard, and beam compensation can be used to compensate for this to improve pupil matching between different system types.

FIGS. 1A-1D shows the different responses of two lithographic systems, that is two machine types denoted machine type A and machine type B. For each type, the beam shape in the pupil plane is shown for two possible beam sizes, that is for the ideal case of an infinitesimally small beam of 0*0 mm and for a realistic beam size of 24*16 mm. It will be seen that the responses of the two machine types differ from one another, and that machine type B is less sensitive to beam shape than machine type A. If one of the machines is provided with a beam adjustment arrangement in accordance with the invention, a better match between the pupil shapes of the two systems is achievable. The figure also shows that smaller beam size leads to improved pupil shape resolution. Accordingly it may be advantageous in certain circumstances to select a smaller beam size (and thus less light for imaging) in order to provide improved pupil-shape accuracy.

The pupils shown in FIGS. 1A-1D for the realistic beam shape of 24*16 mm will result in different imaging behaviour. The beam is not distorted and is assumed to be perfectly rectangular. The difference in response of the two machines is caused by differences in optical design.

A change in the divergence of the projection beam in either the X-direction or the Y-direction or both can lead to sigma deformity, such as the creation of a larger sigma in the X-direction than the sigma in the Y-direction, for example. Generally an increase in the divergence angle of the beam will have an adverse effect on the beam shape in that the edges of the beam become blurred due to the effect of beam divergence. However this can be compensated for by adjusting the optics of the beam conditioning unit so as to reduce the sigma of the beam. In most cases it will be desirable to decrease the beam divergence, but there may be some cases in which the beam divergence requires to be increased.

It is important to appreciate that the magnification optics increases the size of the projection beam but at the same time reduces the angle of divergence of the beam. The angle reduction is directly related to the magnification so that, for example, a two times magnification will halve the angle of divergence. This applies for the small angles of divergence that are encountered in many such machines. In the following magnification, an aperture is used to remove the outer portion of the beam. This may be used, for example to obtain a beam of the same diameter as before but having a smaller angle of divergence. Since the angle of divergence cannot be changed independently, the beam size must also be controlled.

FIG. 3 diagrammatically shows a preferred beam control arrangement in which the laser beam from a laser source 10 is passed through the beam expander optics 17 of a beam conditioning unit and then through an adjustable aperture 11. A tiltable mirror 12 adjacent to the aperture 11 serves to deflect the beam towards the illumination system 13 and is tiltable in the X- and Y-directions so as to adjust the beam position at the entrance of illumination system 13. The beam expander optics 17 serves to change the size and divergence of the beam, whereas the aperture 11 serves to change the size of the beam by virtue of the fact that the periphery of the beam is blocked by the edges of the aperture 11. The order of the beam expander optics 17 and the aperture 11 may be reversed in an alternative embodiment. Furthermore the beam expander optics 17 and the aperture 11 may be positioned downstream of the mirror 12 in another embodiment. However, this is not preferred since the mirror 12 affecting the beam position at the entrance to the illumination system 13 would then be less effective since the beam would be caused to enter the beam expander optics 17 and aperture 11 at a different position in response to adjustment of the mirror 12.

The beam reflected from the mirror 12 is then reflected by a fixed beam delivery mirror 14 towards a further mirror 15 that reflects the beam towards the entrance of the illumination system 13. A partially reflective mirror 16 is disposed in the path of the beam between the mirror 15 and the entrance to the illumination system 13 and serves to split off a small portion (say 1%) of the beam and direct it to a beam analysis module 20 capable of measuring the shape, position, pointing direction and divergence of the beam. Such a beam analysis module 20 may be, for example, as described in U.S. Pat. No. 6,870,603. Both the beam size and the divergence angle of the beam affect the pupil shape produced by the illumination system 13, and the effect of increasing the angle of divergence corresponds to the effect of convolving the pupil that would be obtained with an ideal beam with a pupil corresponding to the angular distribution of the actual beam. An asymmetric shape to the projection beam will result in asymmetry in the pupil shape produced by the illumination system if an illumination system incorporating a conical prism (a so-called "axicon" projection system) is used. This is because the conical prism is not disposed exactly in the pupil plane. It follows that the field size also affects the pupil, and the large beam size reduces the resolution of the pupil.

An electrical feedback signal is supplied from the beam analysis module 20 to actuators 18 and 19 for adjusting the aperture 11 and the beam expander optics 17. The actuators 18 and 19 are actuable in dependence on the feedback signal from the beam analysis module 20 indicative of the beam shape and the angle of divergence of the beam so as to actively control the beam size and its angle of divergence. The angle of divergence of the beam can be increased or decreased to match the pupil shape produced by the illumination system 13 to a target pupil shape (which can correspond to the pupil shape of another machine of the same type or of a different type). Accordingly control electronics can be used to effect the necessary adjustments in dependence on the target pupil shape of the illumination system, in order to produce a beam that has a shape and divergence closer to that required to produce the target pupil shape.

While specific embodiments of the invention have been described above, it will be appreciated that the invention may be practiced otherwise than as described. The description is not intended to limit the invention.

The invention claimed is:

1. A lithographic apparatus comprising:
an illumination system configured to condition a radiation beam;
a support constructed to support a patterning device, the patterning device being constructed to impart a cross-sectional pattern to the radiation beam to form a patterned radiation beam;
a substrate table constructed to hold a substrate;
a projection system configured to project the patterned radiation beam onto a target portion of the substrate;
an adjustable aperture, located upstream of the illumination system in the path of the radiation beam, configured to permit propagation of the radiation beam from a radiation source to the illumination system;
a beam expander, located upstream of the illumination system in the path of the radiation beam, configured to change the size and divergence of the radiation beam;
a detector configured to detect the size and divergence of the radiation beam propagated through the aperture and to provide a feedback signal in dependence thereon;
an actuator configured to effect adjustment of the beam expander, or the aperture, or both the beam expander and the aperture, to vary at least one optical characteristic of the radiation beam; and
a control device configured to control the actuator in response to the feedback signal from the detector.

2. The apparatus of claim 1, wherein the actuator is configured to change the size of the aperture.

3. The apparatus of claim 1, wherein the actuator is configured to optically adjust the beam expander in order to vary the size of the radiation beam.

4. The apparatus of claim 1, wherein the actuator is configured to optically adjust the beam expander in order to vary the divergence of the radiation beam.

5. The apparatus of claim 1, wherein a tiltable beam-positioning reflector is provided for directing the radiation beam propagated through the aperture towards the illumination system.

6. The apparatus of claim 5, wherein the aperture is positioned upstream of the beam-positioning reflector.

7. The apparatus of claim 5, wherein at least one further reflector is provided in the path of the radiation beam between the beam-positioning reflector and the illumination system.

8. The apparatus of claim 1, wherein a diverter is provided for diverting a minor portion of the radiation beam to the detector upstream of the illumination system.

9. The apparatus of claim 8, wherein the diverter is partially transparent.

10. The apparatus of claim 1, wherein the detector is a beam analysis module configured to monitor the size and divergence of the radiation beam.

11. The apparatus of claim 10, wherein the beam analysis module includes a CCD camera.

12. The apparatus of claim 1, wherein the control device is configured to control the actuator so as to render the sigma of the apparatus substantially constant in use.

13. The apparatus of claim 1, wherein the control device is configured to control the actuator so as to match the pupil to a required pupil shape.

14. A device manufacturing method comprising:
directing a beam of radiation from a radiation source to an illumination system;
propagating the radiation beam through a beam expander and an adjustable aperture, wherein the propagating is performed upstream of the illumination system in the path of the radiation beam;
detecting the size and divergence of the radiation beam propagated through the aperture to provide a feedback signal in dependence thereon;
effecting adjustment of the beam expander, or the aperture, or both the beam expander and the aperture, to vary at least one optical characteristic of the radiation beam in response to the feedback signal;
using a patterning device to transmit or reflect the radiation beam and impart a pattern to the cross-section of the radiation beam; and
projecting the patterned beam of radiation onto a target portion of a substrate.

15. The method of claim 14, wherein said adjustment comprises adjusting the size of the aperture.

16. The method of claim 14, wherein said adjustment comprises optically adjusting the beam expander in order to vary the size of the radiation beam.

17. The method of claim 14, wherein said adjustment comprises optically adjusting the beam expander in order to vary the divergence of the radiation beam.

18. The method of claim 14, further comprising reflecting the radiation beam propagated through the aperture by tilting a beam-positioning reflector so as to direct the radiation beam towards the illumination system.

19. The method of claim 14, further comprising diverting a minor portion of the radiation beam for the purpose of detecting the size and divergence of the radiation beam propagated through the aperture.

20. The method of claim 14, wherein said adjustment of the beam expander, or the aperture, or is effected to render the sigma of the apparatus substantially constant in use.

21. The method of claim 14, wherein said adjustment of the beam expander, or the aperture, or both the beam expander and the aperture, is effected to match the pupil to a required pupil shape.

* * * * *